United States Patent
Yuan

(10) Patent No.: US 11,243,275 B2
(45) Date of Patent: Feb. 8, 2022

(54) MAGNETIC FIELD SENSING DEVICE

(71) Applicant: Fu-Te Yuan, New Taipei (TW)

(72) Inventor: Fu-Te Yuan, New Taipei (TW)

(73) Assignee: iSentek Inc., New Taipei (TW)

( * ) Notice: Subject to any disclaimer, the term of this patent is extended or adjusted under 35 U.S.C. 154(b) by 8 days.

(21) Appl. No.: 16/821,971

(22) Filed: Mar. 17, 2020

(65) Prior Publication Data

US 2020/0300943 A1   Sep. 24, 2020

Related U.S. Application Data

(60) Provisional application No. 62/819,681, filed on Mar. 18, 2019.

(51) Int. Cl.
 *G01R 33/09* (2006.01)
 *G01R 35/00* (2006.01)

(52) U.S. Cl.
 CPC .......... *G01R 33/096* (2013.01); *G01R 35/00* (2013.01)

(58) Field of Classification Search
 CPC .. G01R 33/096; G01R 35/00; G01R 33/0017; G01R 33/091; G01R 33/0035
 See application file for complete search history.

(56) References Cited

U.S. PATENT DOCUMENTS

| | | | |
|---|---|---|---|
| 2009/0091344 A1* | 4/2009 | Ausserlechner | G01P 3/487 324/754.29 |
| 2012/0182010 A1* | 7/2012 | Lammel | G01R 33/0035 324/244 |
| 2013/0300402 A1 | 11/2013 | Liu et al. | |
| 2016/0327618 A1* | 11/2016 | Yuan | G01C 17/28 |

FOREIGN PATENT DOCUMENTS

| | | |
|---|---|---|
| CN | 103809135 | 5/2014 |
| TW | 201213833 | 4/2012 |
| TW | I467204 | 1/2015 |
| TW | 201715251 | 5/2017 |

OTHER PUBLICATIONS

"Office Action of Taiwan Counterpart Application", dated Oct. 30, 2020, p. 1-p. 7.

\* cited by examiner

*Primary Examiner* — Tung X Nguyen
*Assistant Examiner* — Feba Pothen
(74) *Attorney, Agent, or Firm* — JCIPRNET

(57) ABSTRACT

A magnetic field sensing device includes first magnetoresistor units, second magnetoresistor units, a first testing conductive line, a second testing conductive line, and a driver. The first magnetoresistor units are arranged in a first direction. The second magnetoresistor units are arranged in the first direction, and the second magnetoresistor units are disposed on a side of the first magnetoresistor units in a second direction. The first testing conductive line is disposed on a side of the first magnetoresistor units in a third direction, and extends in the first direction. The second testing conductive line is disposed on a side of the second magnetoresistor units in the third direction, and extends in the first direction. The driver is configured to make two currents in a same direction and two currents in opposite directions pass through the first testing conductive line and the second testing conductive line at different times, respectively.

10 Claims, 9 Drawing Sheets

MAGNETIC FIELD SENSING DEVICE

CROSS-REFERENCE TO RELATED APPLICATION

This application claims the priority benefit of U.S. provisional application Ser. No. 62/819,681, filed on Mar. 18, 2019. The entirety of the above-mentioned patent application is hereby incorporated by reference herein and made a part of this specification.

BACKGROUND

Technical Field

The disclosure relates to a magnetic field sensing device.

Description of Related Art

A magnetometer is an important element for a system having compass and motion tracking functions. For portable systems such as smartphones, tablet computers or smart watches, or industrial systems such as drones, the magnetometer is required to have a small package size and exhibit high energy efficiency at a high output data rate. These requirements have made magnetoresistance (MR) sensors mainstream, including anisotropic MR (AMR) sensors, giant MR (GMR) sensors, and tunneling MR (TMR) sensors.

For advanced applications such as artificial intelligence (AI), Industry 4.0, or systems with a high degree of automation, self-monitoring for the element itself is a very important function. Therefore, in the research and development of magnetometers, a building-in self-test technology has become an important development direction.

SUMMARY

The invention provides a magnetic field sensing device having a building-in self-test function.

An embodiment of the invention provides a magnetic field sensing device, including a plurality of first magnetoresistor units, a plurality of second magnetoresistor units, a first testing conductive line, a second testing conductive line, and a driver. The first magnetoresistor units are arranged in a first direction. A sensing direction of each first magnetoresistor unit is perpendicular to the first direction. The second magnetoresistor units are arranged in the first direction. A sensing direction of each second magnetoresistor unit is perpendicular to the first direction, and the second magnetoresistor units are disposed on a side of the first magnetoresistor units in a second direction. The first testing conductive line is disposed on a side of the first magnetoresistor units in a third direction, and extends in the first direction. The second testing conductive line is disposed on a side of the second magnetoresistor units in the third direction, and extends in the first direction. The driver is electrically connected to the first testing conductive line and the second testing conductive line, and configured to make two currents in a same direction and two currents in opposite directions pass through the first testing conductive line and the second testing conductive line at different times, respectively.

In an embodiment of the invention, the first magnetoresistor units and the second magnetoresistor units include a plurality of anisotropic magnetoresistors, and the magnetic field sensing device includes at least one magnetization direction setting element, disposed on a side of the first magnetoresistor units and the second magnetoresistor units in the third direction, and configured to set magnetization directions of the anisotropic magnetoresistors as at least one of the first direction and an opposite direction of the first direction, respectively.

In an embodiment of the invention, the first magnetoresistor units and the second magnetoresistor units are electrically connected to form at least one Wheatstone bridge to output a voltage signal corresponding to a magnetic field component in the second direction, or output a voltage signal corresponding to the magnetic field component in the second direction and a magnetic field component in the third direction.

In an embodiment of the invention, the sensing direction of each first magnetoresistor unit is inclined with respect to the second direction, the sensing direction of each second magnetoresistor unit is inclined with respect to the second direction, and an inclination direction of the sensing direction of each first magnetoresistor unit with respect to the second direction is opposite to an inclination direction of the sensing direction of each second magnetoresistor unit with respect to the second direction.

In an embodiment of the invention, an inclination degree of the sensing direction of each first magnetoresistor unit with respect to the second direction is the same as an inclination degree of the sensing direction of each second magnetoresistor unit with respect to the second direction.

In an embodiment of the invention, the magnetic field sensing device further includes a plurality of third magnetoresistor units, a plurality of fourth magnetoresistor units, a third testing conductive line, and a fourth testing conductive line. The third magnetoresistor units are arranged in the first direction. A sensing direction of each third magnetoresistor unit is perpendicular to the first direction. The fourth magnetoresistor units are arranged in the first direction. A sensing direction of each fourth magnetoresistor unit is perpendicular to the first direction, and the first, second, third, and fourth magnetoresistor units are sequentially arranged in the second direction. The third testing conductive line is disposed on a side of the third magnetoresistor units in the third direction, and extends in the first direction. The third testing conductive line and the first testing conductive line are connected in parallel. The fourth testing conductive line is disposed on a side of the fourth magnetoresistor units in the third direction, and extends in the first direction. The fourth testing conductive line and the second testing conductive line are connected in parallel.

In an embodiment of the invention, the first, second, third, and fourth magnetoresistor units are electrically connected to form at least one Wheatstone bridge to output a voltage signal corresponding to a magnetic field component in the second direction, or output a voltage signal corresponding to the magnetic field component in the second direction and a magnetic field component in the third direction.

In an embodiment of the invention, the first, second, third, and fourth magnetoresistor units include a plurality of anisotropic magnetoresistors, and the magnetic field sensing device includes at least one magnetization direction setting element, disposed on a side of the first, second, third, and fourth magnetoresistor units in the third direction, and configured to set magnetization directions of the anisotropic magnetoresistors as at least one of the first direction and an opposite direction of the first direction, respectively.

In an embodiment of the invention, the sensing direction of each first magnetoresistor unit, the sensing direction of each second magnetoresistor unit, the sensing direction of each third magnetoresistor unit, and the sensing direction of each fourth magnetoresistor unit are all inclined with respect to the second direction, an inclination direction of the sensing direction of each first magnetoresistor unit with respect to the second direction is opposite to an inclination direction of the sensing direction of each second magnetoresistor unit with respect to the second direction, an inclination direction of the sensing direction of each third magnetoresistor unit with respect to the second direction is the same as the inclination direction of the sensing direction of each first magnetoresistor unit with respect to the second direction, and an inclination direction of the sensing direction of each fourth magnetoresistor unit with respect to the second direction is the same as the inclination direction of the sensing direction of each second magnetoresistor unit with respect to the second direction.

In an embodiment of the invention, an inclination degree of the sensing direction of each first magnetoresistor unit with respect to the second direction is the same as an inclination degree of the sensing direction of each second magnetoresistor unit with respect to the second direction, an inclination degree of the sensing direction of each third magnetoresistor unit with respect to the second direction is the same as an inclination degree of the sensing direction of each fourth magnetoresistor unit with respect to the second direction, and the inclination degree of the sensing direction of each first magnetoresistor unit with respect to the second direction is the same as the inclination degree of the sensing direction of each third magnetoresistor unit with respect to the second direction.

In an embodiment of the invention, the magnetic field sensing device further includes a substrate and an insulating layer. The first testing conductive line and the second testing conductive line are disposed on the substrate. The insulating layer covers the first testing conductive line and the second testing conductive line. A top of the insulating layer has a groove, the groove has two opposite inclined side walls, and the first magnetoresistor units and the second magnetoresistor units are disposed on the two inclined side walls, respectively.

In the magnetic field sensing device of the embodiments of the invention, since the first testing conductive line and the second testing conductive line are adopted and the driver is used to make two currents in the same direction and two currents in two opposite directions pass through the first testing conductive line and the second testing conductive line at two different times, respectively, the magnetic field sensing device can have the building-in self-test function.

DESCRIPTION OF THE EMBODIMENTS

Figure 1A:
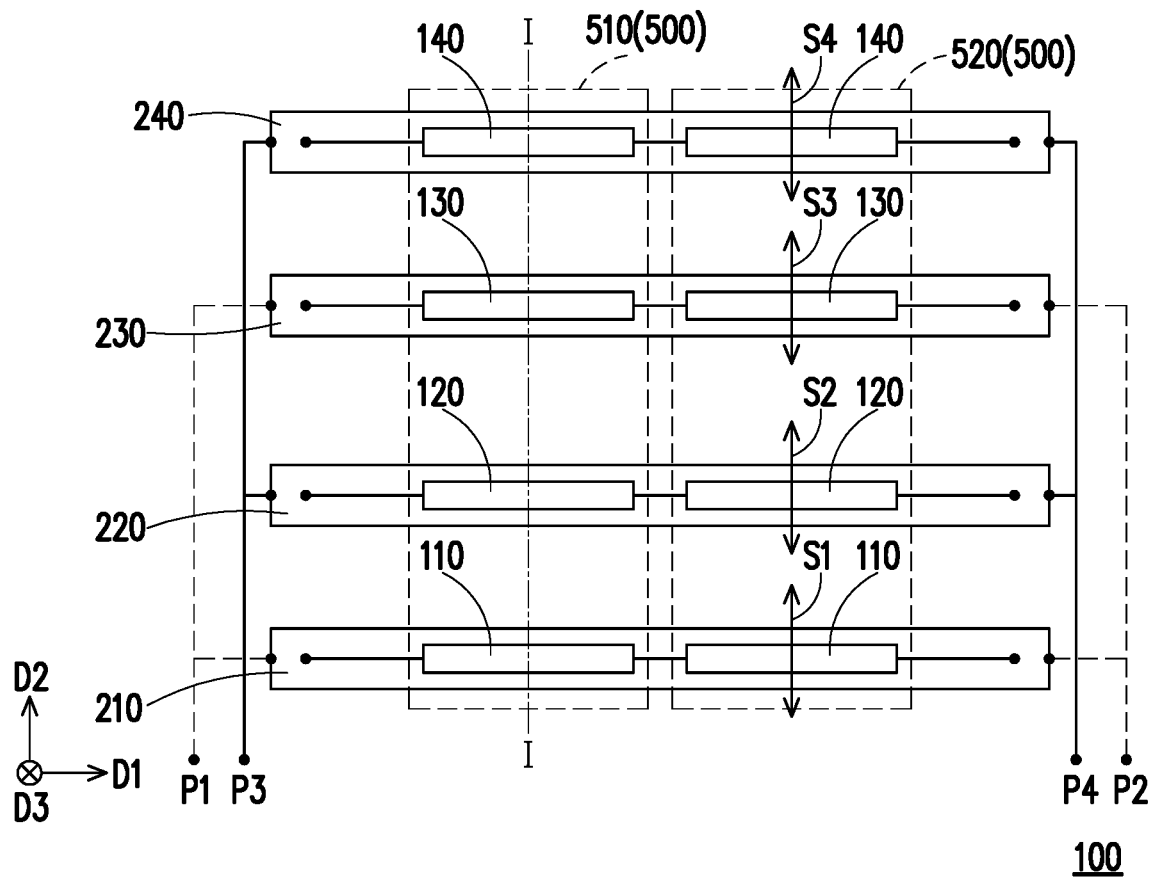
FIG. 1A is a schematic top view of a magnetic field sensing device of an embodiment of the invention.
Figure 1B:
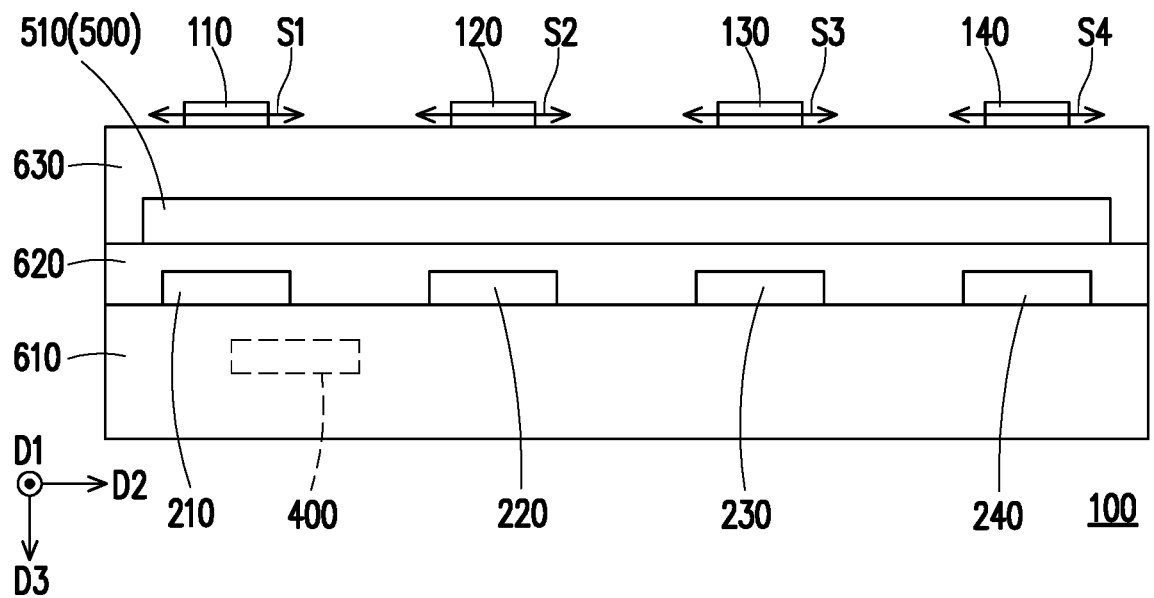
FIG. 1B is a schematic cross-sectional view of the magnetic field sensing device of FIG. 1A taken along a line I-I.

FIG. 1A is a schematic top view of a magnetic field sensing device of an embodiment of the invention, and FIG. 1B is a schematic cross-sectional view of the magnetic field sensing device of FIG. 1A taken along a line I-I. Referring to FIG. 1A and FIG. 1B, a magnetic field sensing device 100 of the present embodiment includes a plurality of first magnetoresistor units 110, a plurality of second magnetoresistor units 120, a first testing conductive line 210, a second testing conductive line 220, and a driver 400. The first magnetoresistor units 110 are arranged in a first direction D1. A sensing direction S1 of each first magnetoresistor unit 110 is perpendicular to the first direction D1. The second magnetoresistor units 120 are arranged in the first direction D1. A sensing direction S2 of each second magnetoresistor unit 120 is perpendicular to the first direction D1, and the second magnetoresistor units 120 are disposed on a side of the first magnetoresistor units 110 in a second direction D2. The first testing conductive line 210 is disposed on a side of the first magnetoresistor units 110 in a third direction D3, and extends in the first direction D1. The second testing conductive line 220 is disposed on a side of the second magnetoresistor units 120 in the third direction D3, and extends in the first direction D1. In the present embodiment, the first direction D1, the second direction D2, and the third direction D3 are perpendicular to each other. However, in other embodiments, the first direction D1, the second direction D2, and the third direction D3 may be three different directions that are not perpendicular to each other.

The driver 400 is electrically connected to the first testing conductive line 210 and the second testing conductive line 220, and configured to make two currents in a same direction and two currents in two opposite directions pass through the first testing conductive line 210 and the second testing conductive line 220 at two different times, respectively.

In the present embodiment, the magnetic field sensing device 100 further includes a plurality of third magnetoresistor units 130, a plurality of fourth magnetoresistor units 140, a third testing conductive line 230, and a fourth testing conductive line 240. The third magnetoresistor units 130 are arranged in the first direction D1. A sensing direction S3 of each third magnetoresistor unit 130 is perpendicular to the first direction D1. The fourth magnetoresistor units 140 are arranged in the first direction D1. A sensing direction S4 of each fourth magnetoresistor unit 140 is perpendicular to the first direction D1. The first, second, third, and fourth magnetoresistor units 110, 120, 130, and 140 are sequentially arranged in the second direction D2. The third testing conductive line 230 is disposed on a side of the third magnetoresistor units 130 in the third direction D3, and extends in the first direction D1. The third testing conductive line 230 and the first testing conductive line 210 are connected in parallel. The fourth testing conductive line 240 is disposed on a side of the fourth magnetoresistor units 140 in the third direction D3, and extends in the first direction D1. The fourth testing conductive line 240 and the second testing conductive line 220 are connected in parallel.

Figure 2A:
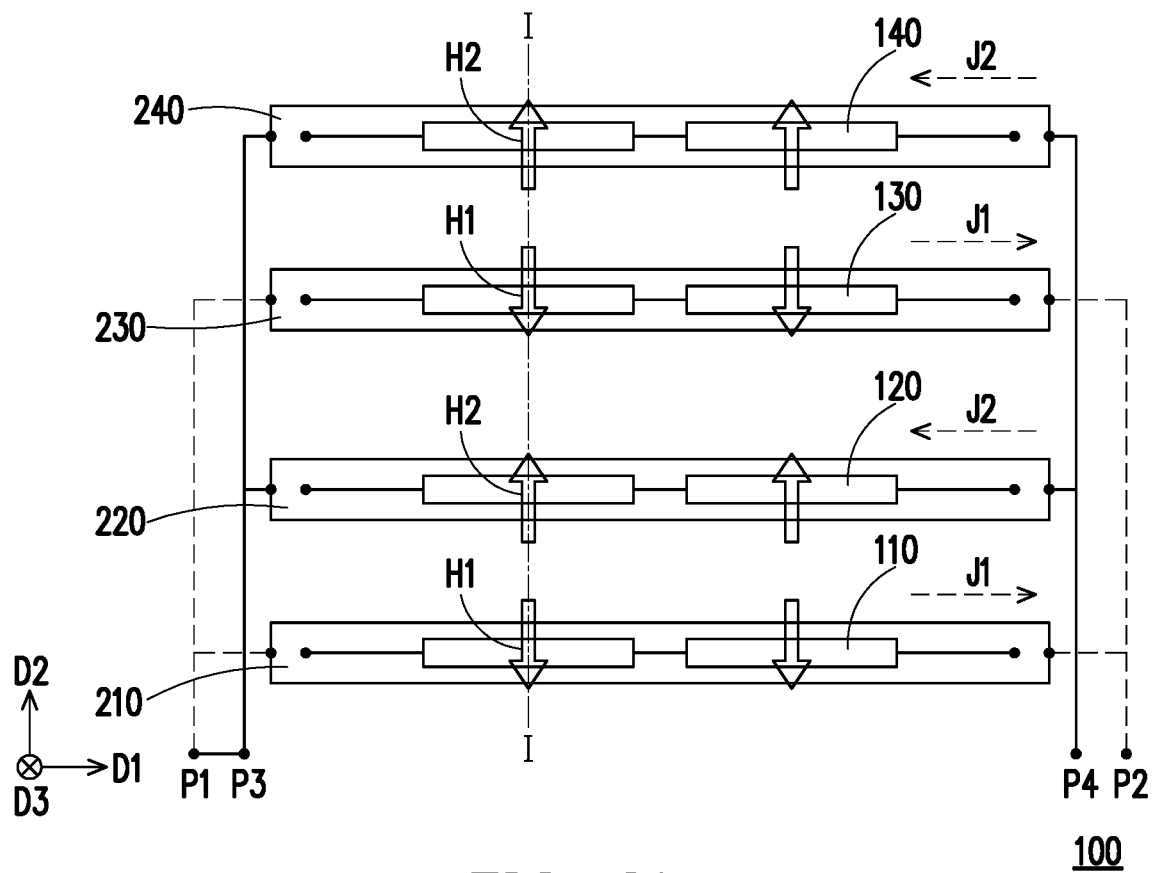
FIG. 2A is a schematic top view of the magnetic field sensing device of FIG. 1A when a driver applies currents in opposite directions to the first testing conductive line and the second testing conductive line.
Figure 2B:
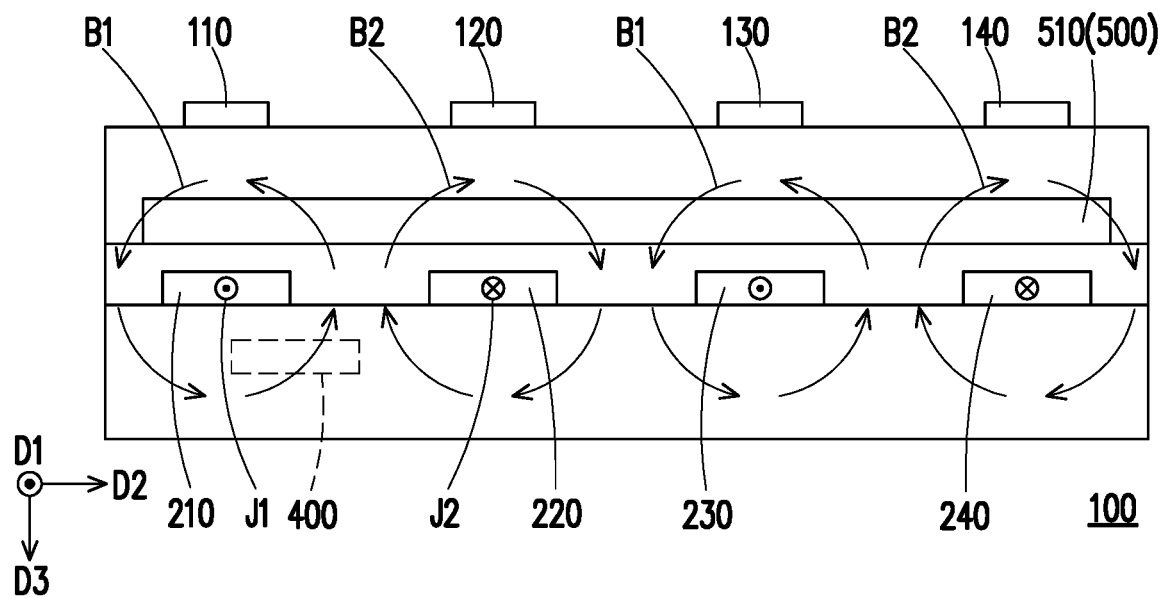
FIG. 2B is a schematic cross-sectional view of the magnetic field sensing device of FIG. 2A taken along the line I-I.
Figure 3A:
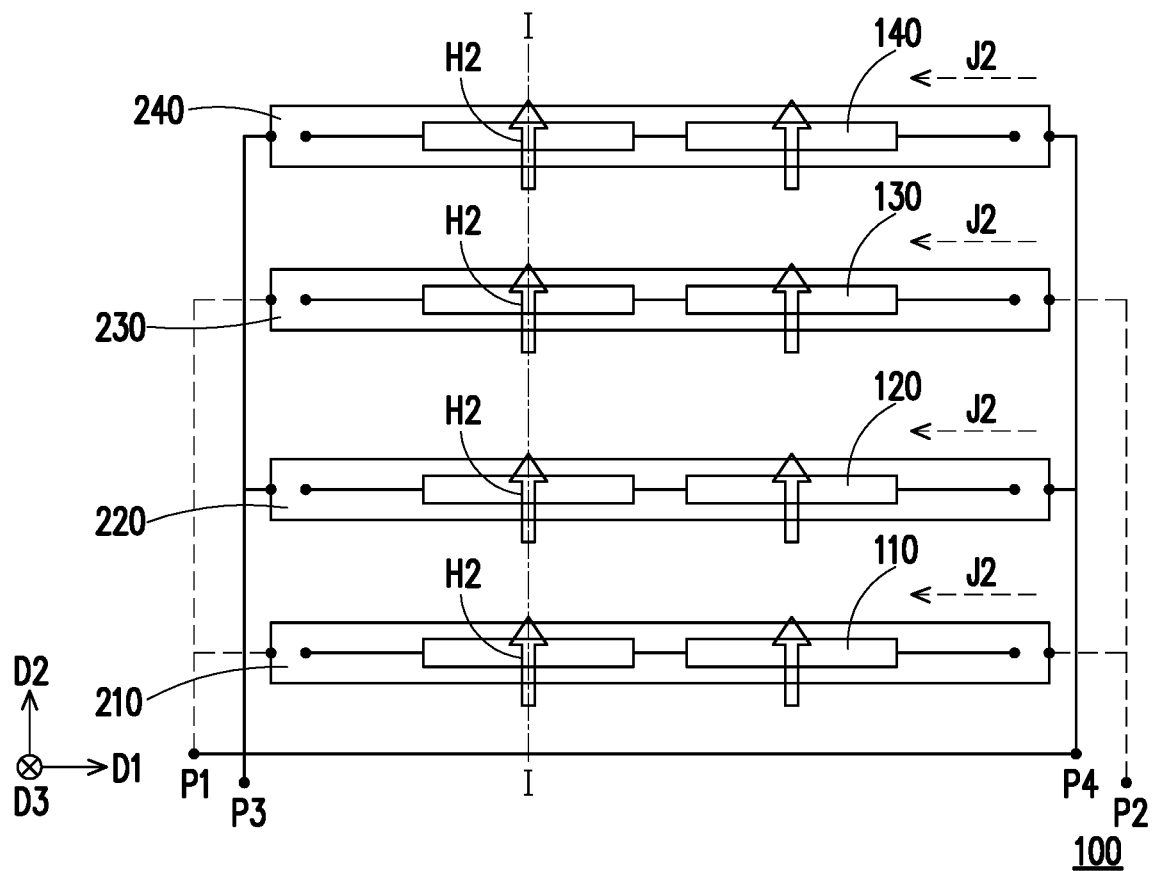
FIG. 3A is a schematic top view of the magnetic field sensing device of FIG. 1A when the driver applies currents in a same direction to the first testing conductive line and the second testing conductive line.
Figure 3B:
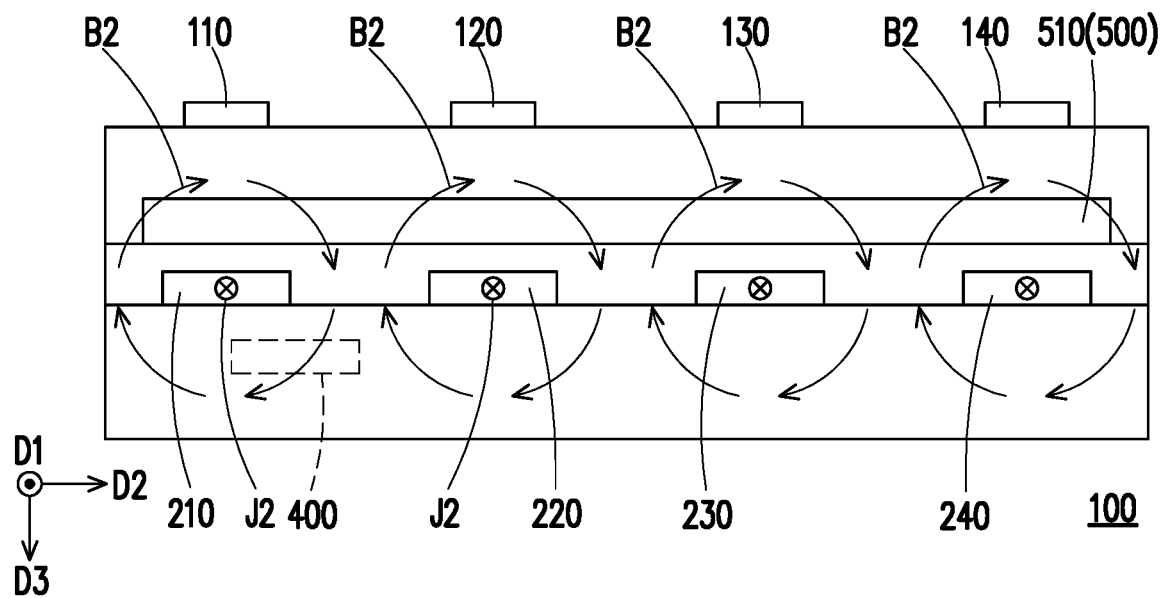
FIG. 3B is a schematic cross-sectional view of the magnetic field sensing device of FIG. 3A taken along the line I-I.

FIG. 2A is a schematic top view of the magnetic field sensing device of FIG. 1A when a driver applies currents in opposite directions to the first testing conductive line and the second testing conductive line, and FIG. 2B is a schematic cross-sectional view of the magnetic field sensing device of FIG. 2A taken along the line I-I. FIG. 3A is a schematic top view of the magnetic field sensing device of FIG. 1A when the driver applies currents in a same direction to the first testing conductive line and the second testing conductive line, and FIG. 3B is a schematic cross-sectional view of the magnetic field sensing device of FIG. 3A taken along the line I-I. Referring to FIG. 2A and FIG. 2B first, at a first time, the driver 400 makes two currents J1 and J2 in opposite directions pass through the first testing conductive line 210 and the second testing conductive line 220, respectively, and makes two currents J1 and J2 in opposite directions pass through the third testing conductive line 230 and the fourth testing conductive line 240, respectively. The direction of the current J1 is, for example, toward the first direction D1, and the direction of the current J2 is, for example, toward an opposite direction of the first direction D1. At this time, on a cross section of FIG. 2B, the first testing conductive line 210 and the third testing conductive line 230 generate a magnetic field B1 in a counterclockwise direction, so that the first magnetoresistor units 110 and the third magnetoresistor units 130 sense a magnetic field parallel to the second direction D2 (for example, a magnetic field toward an opposite direction of the second direction D2). In addition, the second testing conductive line 220 and the fourth testing conductive line 240 generate a magnetic field B2 in a clockwise direction, so that the second magnetoresistor units 120 and the fourth magnetoresistor units 140 sense a magnetic field parallel to the second direction D2 (for example, a magnetic field toward the second direction D2), but its direction H1 is opposite to a direction H2 of the magnetic field sensed by the first magnetoresistor units 110 and the third magnetoresistor units 130. In the present embodiment, the direction H1 is opposite to the second direction D2, and the direction H2 is the same as the second direction D2. Specifically, a switch in the driver 400 connects a terminal P1 and a terminal P3 so as to be turned on, and the driver 400 injects a current at a terminal P4 and makes the current flow out from a terminal P2, so that the current J1, the current J2, the current J1, and the current J2 can be generated in the first, second, third, and fourth testing conductive lines 210, 220, 230, and 240, respectively.

At a second time different from the first time, as shown in FIG. 3A and FIG. 3B, the driver 400 makes currents J2 in a same direction pass through the first testing conductive line 210 and the second testing conductive line 220, and makes currents J2 in a same direction pass through the third testing conductive line 230 and the fourth testing conductive line 240. At this time, on a cross section of FIG. 3B, the first testing conductive line 210, the second testing conductive line 220, the third testing conductive line 230, and the fourth testing conductive line 240 all generate a magnetic field B2 in a clockwise direction, so that the first magnetoresistor units 110, the second magnetoresistor units 120, the third magnetoresistor units 130, and the fourth magnetoresistor units 140 all sense a magnetic field parallel to the second direction D2, and directions H2 of the magnetic field sensed by the first, second, third, and fourth magnetoresistor units 110, 120, 130, and 140 are all the same direction. Specifically, the switch in the driver 400 connects the terminal P1 and the terminal P4 so as to be turned on, and the driver 400 injects a current at the terminal P2 and makes the current flow out from the terminal P3, so that the current J2 can be generated in all the first, second, third, and fourth testing conductive lines 210, 220, 230, and 240.

In this way, the magnetic fields B1 and B2 generated at the first time and the second time can be used as reference magnetic fields of the first, second, third, and fourth magnetoresistor units 110, 120, 130, and 140, so that circuits of the first, second, third, and fourth magnetoresistor units 110, 120, 130, and 140 can correct the first, second, third, and fourth magnetoresistor units 110, 120, 130, and 140 by the reference magnetic fields, and thus, the magnetic field sensing device 100 of the present embodiment can have the building-in self-test function.

Referring to FIG. 1A and FIG. 1B again, in the present embodiment, the first magnetoresistor units 110, the second magnetoresistor units 120, the third magnetoresistor units 130, and the fourth magnetoresistor units 140 include a plurality of anisotropic magnetoresistors, and the magnetic field sensing device 100 includes at least one magnetization direction setting element 500 (in FIG. 1A, two magnetization direction setting elements 510 and 520 are taken as an example), disposed on a side of the first magnetoresistor units 110, the second magnetoresistor units 120, the third magnetoresistor units 130, and the fourth magnetoresistor units 140 in the third direction D3, and configured to set magnetization directions of the anisotropic magnetoresistors as at least one of the first direction D1 and the opposite direction of the first direction D1, respectively. For example, the magnetization direction setting element 510 is disposed below the first, second, third, and fourth magnetoresistor units 110, 120, 130, and 140 on the left half of FIG. 1A, and the magnetization direction setting element 520 is disposed below the first, second, third, and fourth magnetoresistor units 110, 120, 130, and 140 on the right half of FIG. 1A. The magnetization direction setting elements 510 and 520 are, for example, conductive lines, which extend in the second direction D2. The magnetization direction setting element 510 is adapted to be applied with a current in the opposite direction of the second direction D2, so that the magnetization directions of the first, second, third, and fourth magnetoresistor units 110, 120, 130, and 140 on the left half of FIG. 1A are set as the opposite direction of the first direction D1, and the magnetization direction setting element 520 is adapted to be applied with a current in the second direction D2, so that the magnetization directions of the first, second, third, and fourth magnetoresistor units 110, 120, 130, and 140 on the right half of FIG. 1A are set as the first direction D1. Alternatively, the magnetization direction setting element 510 is adapted to be applied with the current in the second direction D2, so that the magnetization directions of the first, second, third, and fourth magnetoresistor units 110, 120, 130, and 140 on the left half of FIG. 1A are set as the first direction D1, and the magnetization direction setting element 520 is adapted to be applied with the current in the opposite direction of the second direction D2, so that the magnetization directions of the first, second, third, and fourth magnetoresistor units 110, 120, 130, and 140 on the right half of FIG. 1A are set as the opposite direction of the first direction D1.

Figure 4A:
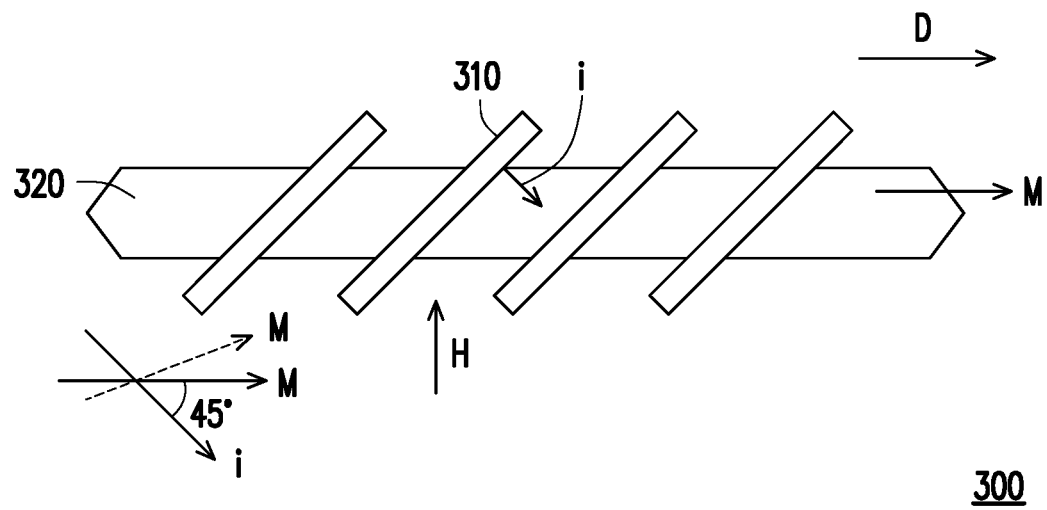
FIG. 4A and FIG. 4B are used to illustrate an operation principle of anisotropic magnetoresistors in FIG. 1A.
Figure 4B:
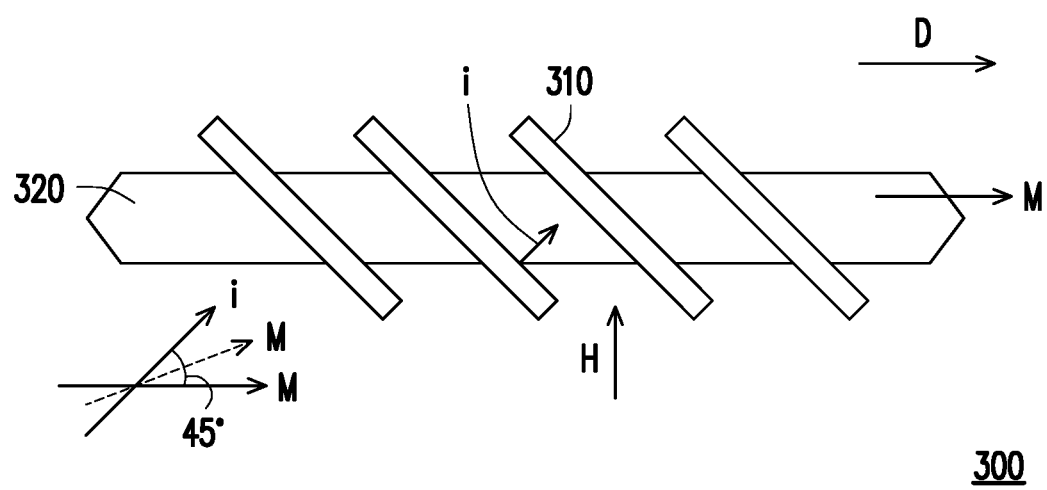

FIG. 4A and FIG. 4B are used to illustrate an operation principle of the anisotropic magnetoresistors in FIG. 1A. Referring to 4A first, each of the first, second, third, and fourth magnetoresistor units 110, 120, 130, and 140 of FIG. 1A may include one or more anisotropic magnetoresistors 300, the anisotropic magnetoresistor 300 has a barber pole-like structure, that is, its surface is provided with a plurality of electrical shorting bars 310 extending at an angle of 45 degrees with respect to an extending direction D of the anisotropic magnetoresistor 300, the electrical shorting bars 310 are spaced apart from each other and disposed in parallel on a ferromagnetic film 320, the ferromagnetic film 320 is a main body of the anisotropic magnetoresistor 300, and an extending direction thereof is the extending direction D of the anisotropic magnetoresistor 300. In addition, two opposite ends of the ferromagnetic film 320 may be made sharp.

Before the anisotropic magnetoresistor 300 starts to measure an external magnetic field H, its magnetization direction may be set by the magnetization direction setting element 510 first. The magnetization direction setting element 510 is, for example, a coil, a conductive line, a metal sheet, or a conductor that may generate a magnetic field by being energized. In FIG. 4A, the magnetization direction setting element 510 may generate a magnetic field in the extending direction D by being energized, so that the anisotropic magnetoresistor 300 has a magnetization direction M.

Next, the magnetization direction setting element 510 is de-energized, so that the anisotropic magnetoresistor 300 starts to measure the external magnetic field H. When there is no external magnetic field H, the magnetization direction M of the anisotropic magnetoresistor 300 remains in the extending direction D. At this time, a current i is applied, so that the current i flows from a left end to a right end of the anisotropic magnetoresistor 300, and then a flow direction of the current i near the electrical shorting bar 310 is perpendicular to an extending direction of the electrical shorting bar 310, so that the flow direction of the current i near the electrical shorting bar 310 and the magnetization direction M have an included angle of 45 degrees. At this time, a resistance value of the anisotropic magnetoresistor 300 is R.

When an external magnetic field H is toward a direction perpendicular to the extending direction D, the magnetization direction M of the anisotropic magnetoresistor 300 will be deflected toward the direction of the external magnetic field H, so that the included angle between the magnetization direction and the flow direction of the current i near the electrical shorting bar is greater than 45 degrees. At this time, the resistance value of the anisotropic magnetoresistor 300 has a change of −ΔR, that is, the resistance value becomes R−ΔR, that is, the resistance value becomes smaller, and ΔR is greater than 0.

However, as shown in FIG. 4B, when the extending direction of the electrical shorting bar 310 of FIG. 4B is set as a direction that has an included angle of 90 degrees with the extending direction of the electrical shorting bar 310 of FIG. 4A (at this time, the extending direction of the electrical shorting bar 310 of FIG. 4B still has an included angle of 45 degrees with the extending direction D of the anisotropic magnetoresistor 300), and when there is an external magnetic field H, the external magnetic field H will still deflect the magnetization direction M toward the direction of the external magnetic field H, the included angle between the magnetization direction M and the flow direction of the current i near the electrical shorting bar 310 will be less than 45 degrees, so that the resistance value of the anisotropic magnetoresistor 300 will become R+ΔR, that is, the resistance value of the anisotropic magnetoresistor 300 becomes larger.

In addition, when the magnetization direction M of the anisotropic magnetoresistor 300 is set as the opposite direction shown in FIG. 4A by the magnetization direction setting element 510, the resistance value of the anisotropic magnetoresistor 300 of FIG. 4A under the external magnetic field H will become R+ΔR afterwards. Furthermore, when the magnetization direction M of the anisotropic magnetoresistor 300 is set as the opposite direction shown in FIG. 4B by the magnetization direction setting element 510, the resistance value of the anisotropic magnetoresistor 300 of FIG. 4B under the external magnetic field H will become R−ΔR afterwards.

Based on the above, when the setting direction of the electrical shorting bar 310 changes, the resistance value R of the anisotropic magnetoresistor 300 will change from +ΔR to −ΔR in response to the change of the external magnetic field H or vice versa, and when the magnetization direction M set by the magnetization direction setting element 510 changes to the opposite direction, the resistance value R of the anisotropic magnetoresistor 300 will change from +ΔR to −ΔR in response to the change of the external magnetic field H or vice versa. When the direction of the external magnetic field H becomes the opposite direction, the resistance value R of the anisotropic magnetoresistor 300 will change from +ΔR to −ΔR in response to the change of the external magnetic field H or vice versa. However, when the current i passing through the anisotropic magnetoresistor 300 becomes the opposite direction, the resistance value R of the anisotropic magnetoresistor 300 remains the same plus or minus sign as before in response to the change of the external magnetic field H, that is, if it was +ΔR originally, it is still +ΔR after the change of the current direction, and if it is −ΔR originally, it is still −ΔR after the change of the current direction.

According to the above principle, the extending direction D of the electrical shorting bar 310 or the magnetization direction M set by the magnetization direction setting element 510 may be designed to determine, when the anisotropic magnetoresistor 300 receives a certain component of the external magnetic field H, a direction of change of the resistance value R of the anisotropic magnetoresistor 300, that is, the resistance value R becomes larger or smaller, for example, the amount of change is +ΔR or −ΔR.

Figure 5:
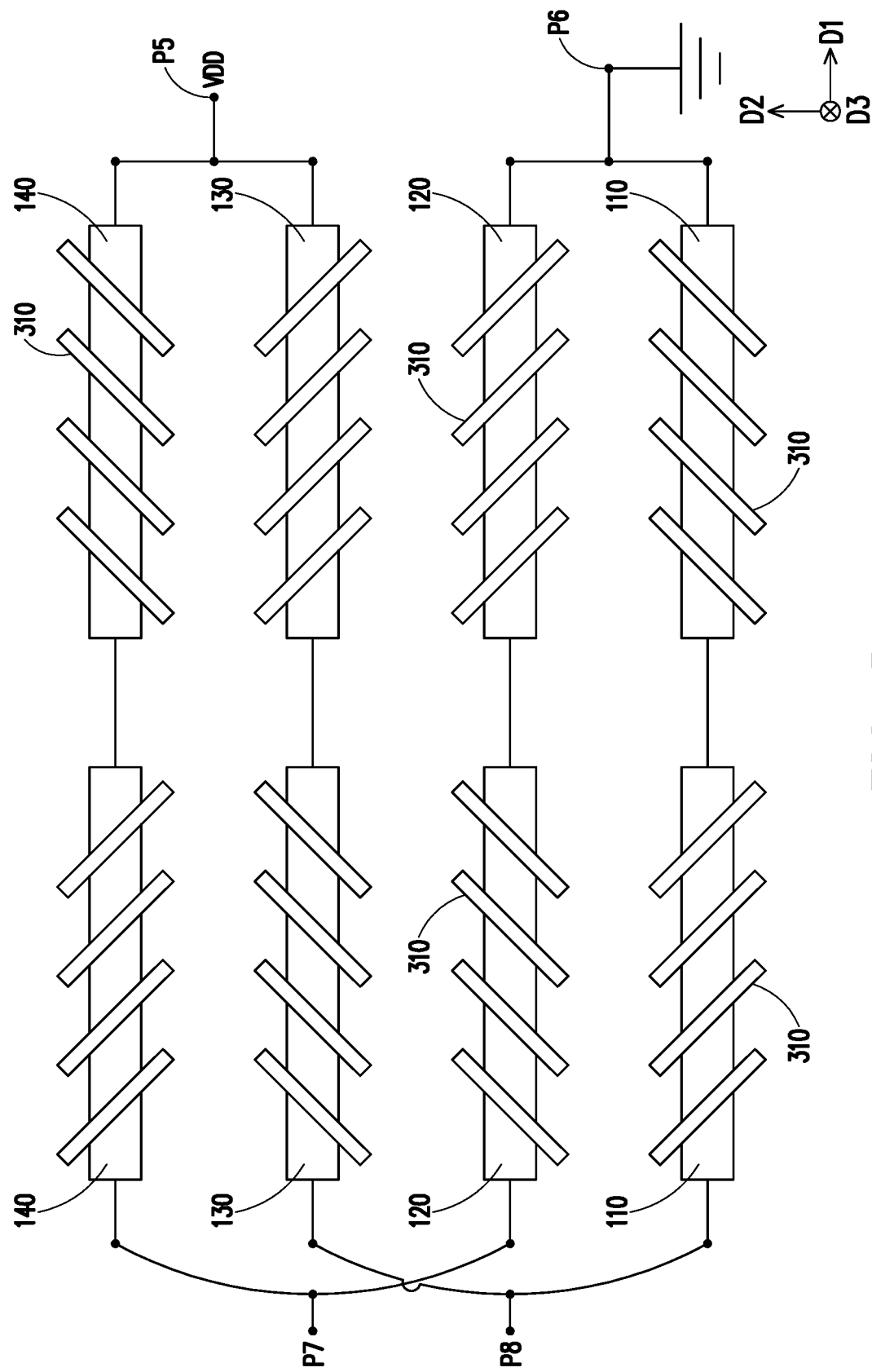
FIG. 5 shows first, second, third, and fourth magnetoresistor units of FIG. 1A being connected to form a Wheatstone bridge.

FIG. 5 shows first, second, third, and fourth magnetoresistor units of FIG. 1A being connected to form a Wheatstone bridge. Referring to FIG. 1A and FIG. 5, the first, second, third, and fourth magnetoresistor units 110, 120, 130, and 140 are electrically connected to form at least one Wheatstone bridge (for example, the Wheatstone bridge as shown in FIG. 5) to output a voltage signal corresponding to a magnetic field component in the second direction D2. For example, when a terminal P5 of the Wheatstone bridge of FIG. 5 receives a reference voltage VDD and a terminal P6 is coupled to the ground, a voltage difference between a terminal P7 and a terminal P8 may be an output signal, and the output signal is a differential signal of which the magnitude will correspond to the magnitude of the magnetic field component in the second direction D2. FIG. 5 also shows extending directions of the electrical shorting bars 310 of the first, second, third, and fourth magnetoresistor units 110, 120, 130, and 140, but this is only one of examples. In other embodiments, the extending directions of the electrical shorting bars 310 of the first, second, third, and fourth magnetoresistor units 110, 120, 130, and 140 may be various other proper extending directions. The invention is not limited thereto. In addition, the Wheatstone bridge shown in FIG. 5 is also only one of the examples. In other embodiments, they may also be connected to form other Wheatstone bridges in other connection manners (that is, other types of Wheatstone bridges).

Since directions of reference magnetic fields generated by the first, second, third, and fourth testing conductive lines 210, 220, 230, and 240 at the first, second, third, and fourth magnetoresistor units 110, 120, 130, and 140 are all parallel to the second direction D2, when the Wheatstone bridge shown in FIG. 5 senses the reference magnetic fields of FIG. 3A, the sensing accuracy of the Wheatstone bridge to the magnetic field component in the second direction D2 can be corrected.

Referring to FIG. 1B, in the present embodiment, the magnetic field sensing device 100 further includes a substrate 610, an insulating layer 620, and an insulating layer 630. The substrate 610 is, for example, a semiconductor substrate or other circuit substrate, and the driver 400 is disposed in the substrate 610 or on the substrate 610. The first, second, third, and fourth testing conductive lines 210, 220, 230, and 240 are disposed on the substrate 610, and the insulating layer 630 covers the first, second, third, and fourth testing conductive lines 210, 220, 230, and 240. Specifically, the insulating layer 620 covers the first, second, third, and fourth testing conductive lines 210, 220, 230, and 240, the magnetization direction setting element 500 is disposed on the insulating layer 620, the insulating layer 630 covers the magnetization direction setting element 500, and the first, second, third, and fourth magnetoresistor units 110, 120, 130, and 140 are disposed on the insulating layer 630.

Figure 6A:
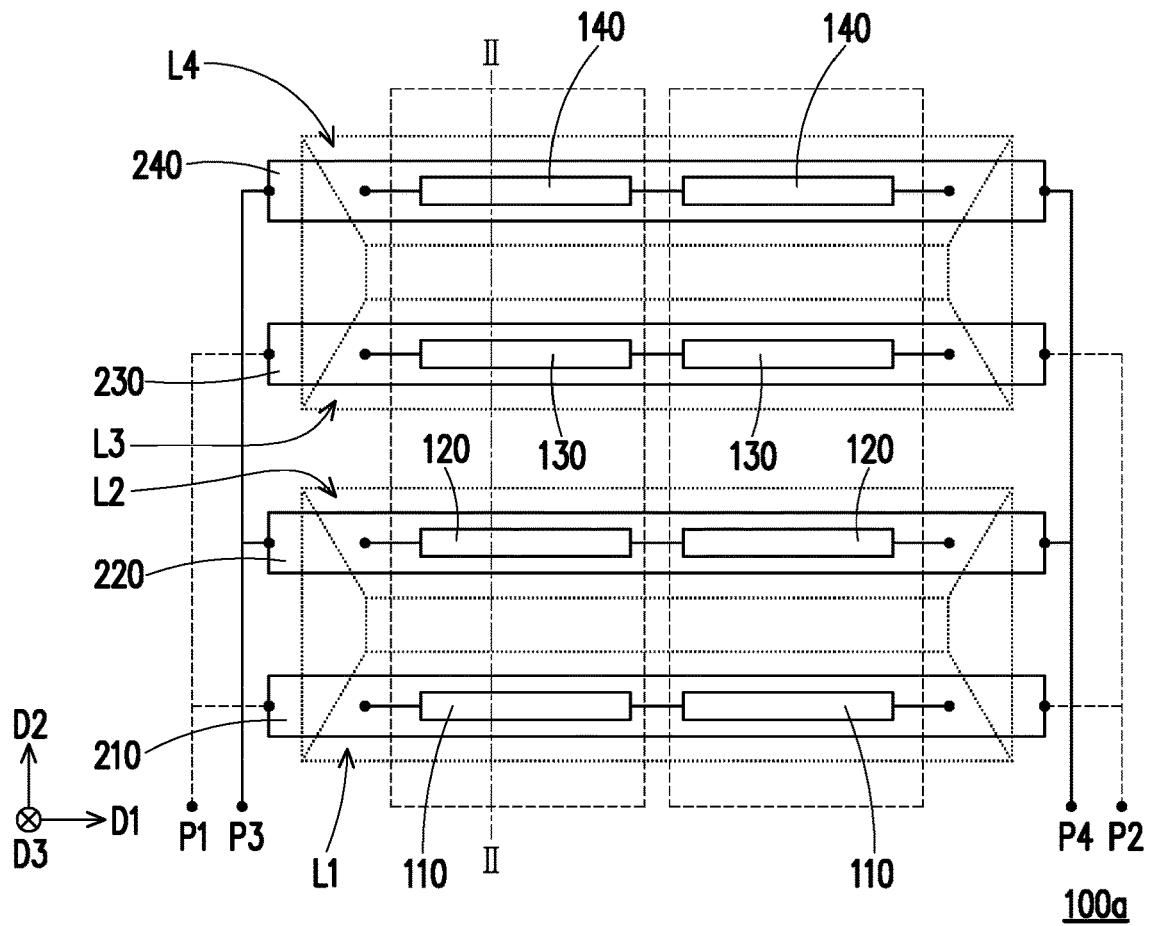
FIG. 6A is a schematic top view of a magnetic field sensing device of another embodiment of the invention.
Figure 6B:
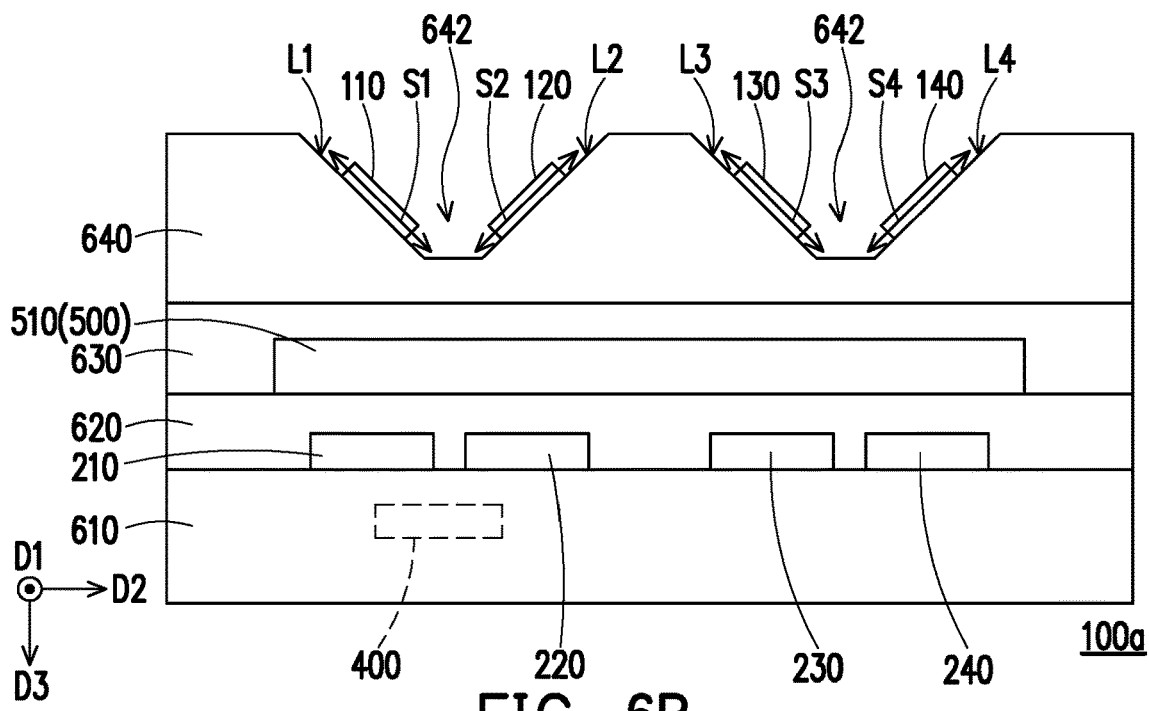
FIG. 6B is a schematic cross-sectional view of the magnetic field sensing device of FIG. 6A taken along a line II-II.

FIG. 6A is a schematic top view of a magnetic field sensing device of another embodiment of the invention, and FIG. 6B is a schematic cross-sectional view of the magnetic field sensing device of FIG. 6A taken along a line II-II. Referring to FIG. 6A and FIG. 6B, the magnetic field sensing device 100a of the present embodiment is similar to the magnetic field sensing device 100 of FIG. 1A and FIG. 1B, and the differences between the two are described below. The magnetic field sensing device 100a of the present embodiment further includes an insulating layer 640 covering the first, second, third, and fourth testing conductive lines 210, 220, 230, and 240. Specifically, in the present embodiment, the insulating layer 640 is disposed on the insulating layer 630. A top of the insulating layer 640 has a plurality of grooves 642, and each groove 642 has two opposite inclined side walls. For example, the groove on the left side of FIG. 6B has two opposite inclined side walls L1 and L2, and the groove on the right side of FIG. 6B has two opposite inclined side walls L3 and L4. The first magnetoresistor units 110 and the second magnetoresistor units 120 are disposed on the inclined side wall L1 and the inclined side wall L2, respectively, and the third magnetoresistor units 130 and the fourth magnetoresistor units 140 are disposed on the inclined side wall L3 and the inclined side wall L4, respectively.

Since the first, second, third, and fourth magnetoresistor units 110, 120, 130, and 140 are disposed on the inclined side walls L1, L2, L3, and L4, the sensing direction S1 of each first magnetoresistor unit 110, the sensing direction S2 of each second magnetoresistor unit 120, the sensing direction S3 of each third magnetoresistor unit 130, and the sensing direction S4 of each fourth magnetoresistor unit 140 are all inclined with respect to the second direction D2. In the present embodiment, an inclination direction of the sensing direction S1 of each first magnetoresistor unit 110 with respect to the second direction D2 is opposite to an inclination direction of the sensing direction S2 of each second magnetoresistor unit 120 with respect to the second direction D2, an inclination direction of the sensing direction S3 of each third magnetoresistor unit 130 with respect to the second direction D2 is the same as the inclination direction of the sensing direction S1 of each first magnetoresistor unit 110 with respect to the second direction D2, and an inclination direction of the sensing direction S4 of each fourth magnetoresistor unit 140 with respect to the second direction D2 is the same as the inclination direction of the sensing direction S2 of each second magnetoresistor unit 120 with respect to the second direction D2.

In the present embodiment, an inclination degree of the sensing direction S1 of each first magnetoresistor unit 110 with respect to the second direction D2 is the same as an inclination degree of the sensing direction S2 of each second magnetoresistor unit 120 with respect to the second direction D2, an inclination degree of the sensing direction S3 of each third magnetoresistor unit 130 with respect to the second direction D2 is the same as an inclination degree of the sensing direction S4 of each fourth magnetoresistor unit 140 with respect to the second direction D2, and the inclination degree of the sensing direction S1 of each first magnetoresistor unit 110 with respect to the second direction D2 is the same as the inclination degree of the sensing direction S3 of each third magnetoresistor unit 130 with respect to the second direction D2.

In the present embodiment, since the first, second, third, and fourth magnetoresistor units 110, 120, 130, and 140 are all disposed on the inclined side walls, each anisotropic magnetoresistor can both sense the magnetic field component in the second direction D2 and the magnetic field component in the third direction D3. Therefore, when the first, second, third, and fourth magnetoresistor units 110, 120, 130, and 140 are connected to form the Wheatstone bridge as shown in FIG. 5, the reference voltage VDD is received at the terminal P5 and the terminal P6 is coupled to the ground, the voltage difference between the terminal P7 and the terminal P8 may be an output signal, the output signal is a differential signal of which the magnitude will correspond to the magnitude of the magnetic field component in the second direction D2, and influences of the magnetic field component in the third direction D3 on the first, second, third, and fourth magnetoresistor units 110, 120, 130, and 140 are offset within the Wheatstone bridge, so that the influences do not contribute to the voltage difference between the terminal P7 and the terminal P8. That is, when the Wheatstone bridge is formed, it is possible to measure only the magnetic field component in the second direction D2 without being influenced by the magnetic field component in the third direction D3.

Figure 7:
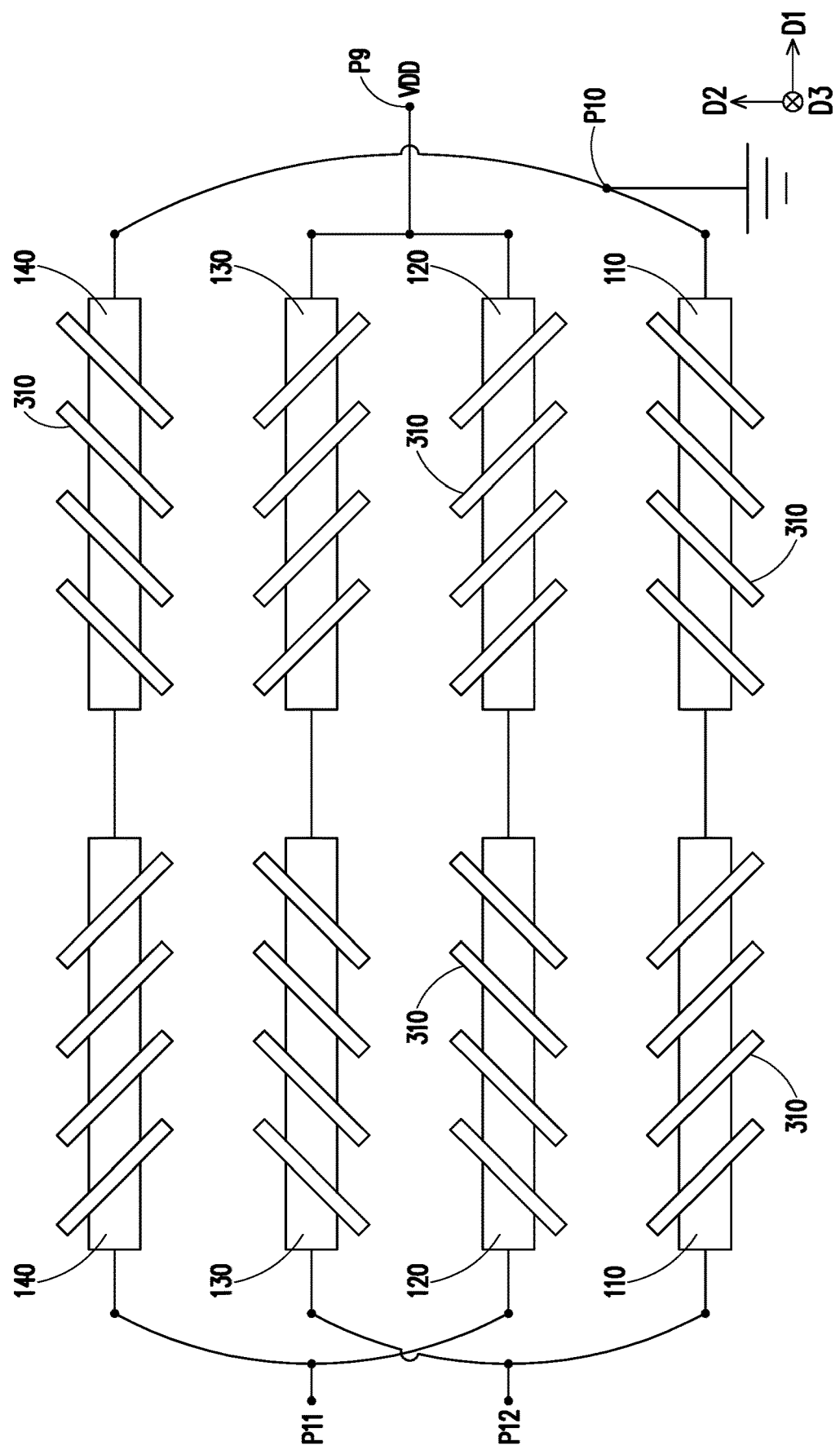
FIG. 7 shows first, second, third, and fourth magnetoresistor units of FIG. 6A being connected to form another Wheatstone bridge.

In addition, at another time, the first, second, third, and fourth magnetoresistor units 110, 120, 130, and 140 are connected to form the Wheatstone bridge as shown in FIG. 7, the reference voltage VDD is received at a terminal P9 and a terminal P10 is coupled to the ground, a voltage difference between a terminal P11 and a terminal P12 may be an output signal, the output signal is a differential signal of which the magnitude will correspond to the magnitude of the magnetic field component in the third direction D3, and influences of the magnetic field component in the second direction D2 on the first, second, third, and fourth magnetoresistor units 110, 120, 130, and 140 are offset within the Wheatstone bridge, so that the influences do not contribute to the voltage difference between the terminal P11 and the terminal P12. That is, when the Wheatstone bridge is formed, it is possible to measure only the magnetic field component in the third direction D3 without being influenced by the magnetic field component in the second direction D2.

Switching between the Wheatstone bridge of FIG. 5 and the Wheatstone bridge of FIG. 7 may be implemented by a switch located in the substrate 610. In other words, in the present embodiment, the first, second, third, and fourth magnetoresistor units 110, 120, 130, and 140 are connected to form the two different Wheatstone bridges to output voltage signals corresponding to the magnetic field component in the second direction D2 and the magnetic field component in the third direction, respectively. However, in other embodiments, it is also possible to use only one Wheatstone bridge (for example, only use the Wheatstone bridge of FIG. 5), but the magnetization direction of the first and third magnetoresistor units 110 and 130 is changed into the original opposite direction by the magnetization direction setting element 500 at another time, so that the function of respectively measuring the magnetic field component in the second direction D2 and the magnetic field component in the third direction D3 at two different times by using only one Wheatstone bridge can be achieved. Switching of the magnetic field generated by the magnetization direction setting element 500 may be achieved by the design of wiring of the magnetization direction setting element 500 and switching of a switching circuit in the substrate 610.

Figure 8:
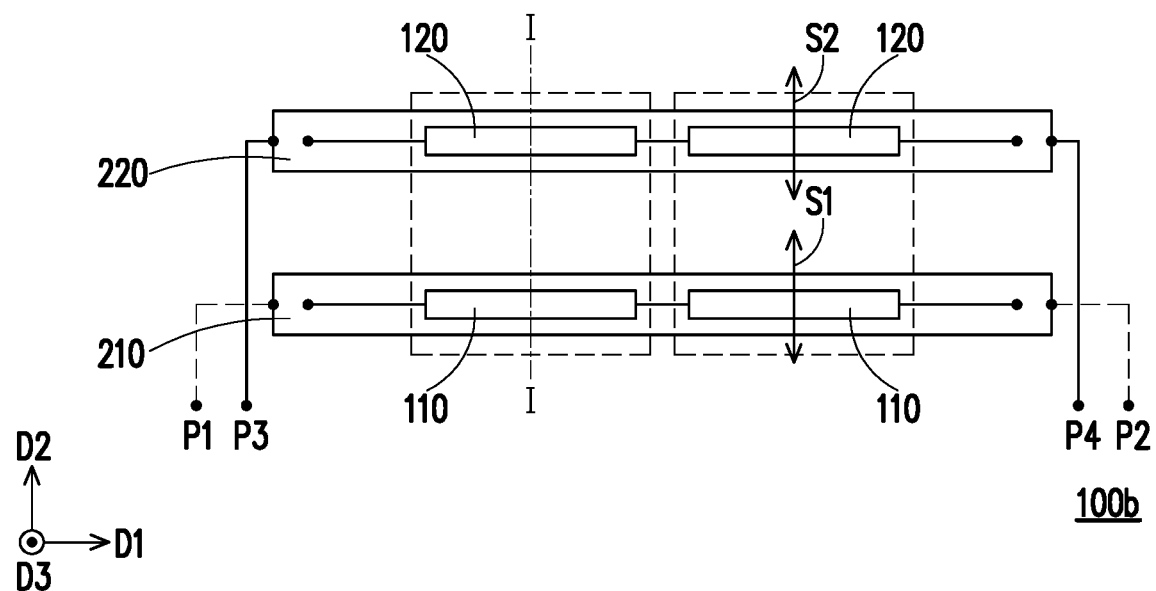
FIG. 8 is a schematic top view of a magnetic field sensing device of still another embodiment of the invention.

FIG. 8 is a schematic top view of a magnetic field sensing device of still another embodiment of the invention. Referring to FIG. 8, the magnetic field sensing device 100b of the present embodiment is similar to the magnetic field sensing device 100 of FIG. 1A, and the differences between the two are described below. The magnetic field sensing device 100 of FIG. 1A uses the first, second, third, and fourth magnetoresistor units 110, 120, 130, and 140 and the first, second, third, and fourth testing conductive lines 210, 220, 230, and 240 to sense the magnetic field and perform self-correction. However, the magnetic field sensing device 100b of the present embodiment may use only the first and second magnetoresistor units 110 and 120 and the first and second testing conductive lines 210 and 220 to sense the magnetic field and perform self-correction, and the first, second, third, and fourth magnetoresistor units 110, 120, 130, and 140 may be connected to form a Wheatstone bridge to sense the magnetic field component in the second direction D2. Similarly, the magnetic field sensing device 100a of FIG. 6A may also be changed to use only the first and second magnetoresistor units 110 and 120 and the first and second testing conductive lines 210 and 220 to sense the magnetic field and perform self-correction, and the first, second, third, and fourth magnetoresistor units 110, 120, 130, and 140 may be connected to form at least one Wheatstone bridge to sense the magnetic field components in the second direction D2 and the third direction D3.

Figure 9:
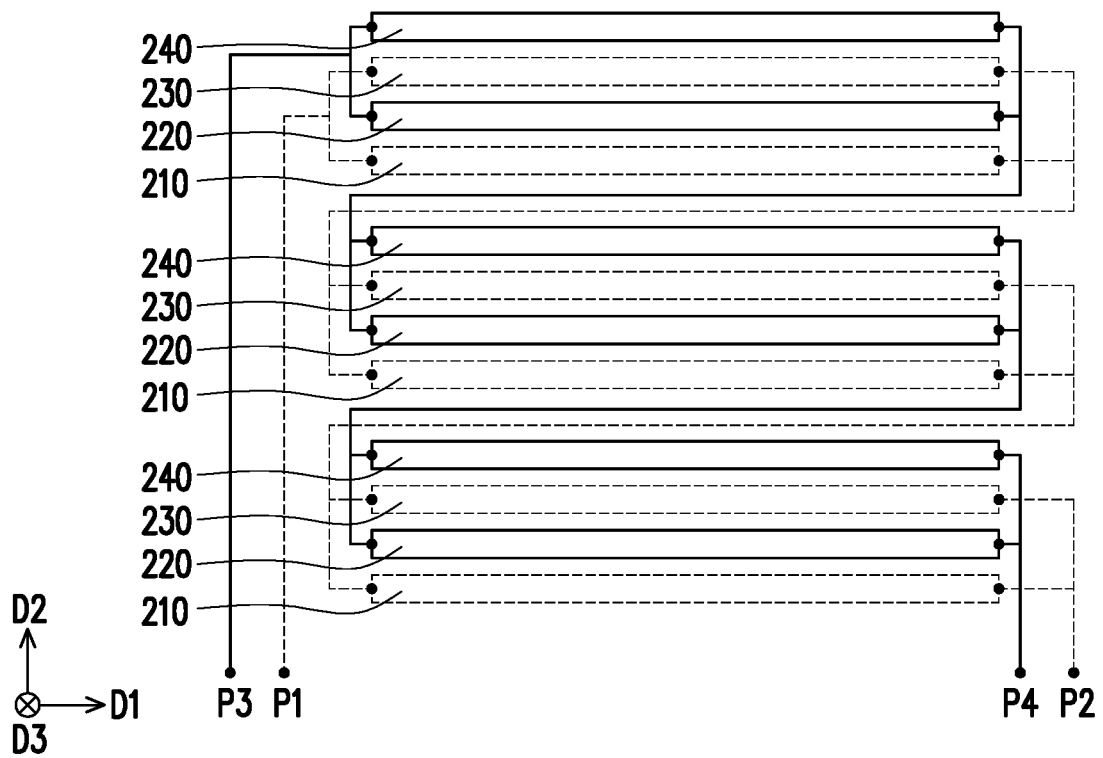
FIG. 9 is a schematic top view of testing conductive lines of a magnetic field sensing device of yet another embodiment of the invention.

FIG. 9 is a schematic top view of testing conductive lines of a magnetic field sensing device of yet another embodiment of the invention. Referring to FIG. 9, the magnetic field sensing device of the present embodiment has a plurality of groups of the first, second, third, and fourth testing conductive lines 210, 220, 230, 240 as shown in FIG. 1A, the first and third testing conductive lines 210 and 230 in the groups of testing conductive lines are connected in series with each other, and the second and fourth testing conductive lines 220 and 240 in the groups of testing conductive lines are connected in series with each other. In addition, the first, second, third, and fourth magnetoresistor units 110, 120, 130, and 140 are disposed above each group of the first, second, third, and fourth testing conductive lines 210, 220, 230, and 240, respectively, and are not shown in FIG. 9. Such a magnetic field sensing device can also achieve the building-in self-test function of the magnetic field sensing device of FIG. 1A.

Figure 10:
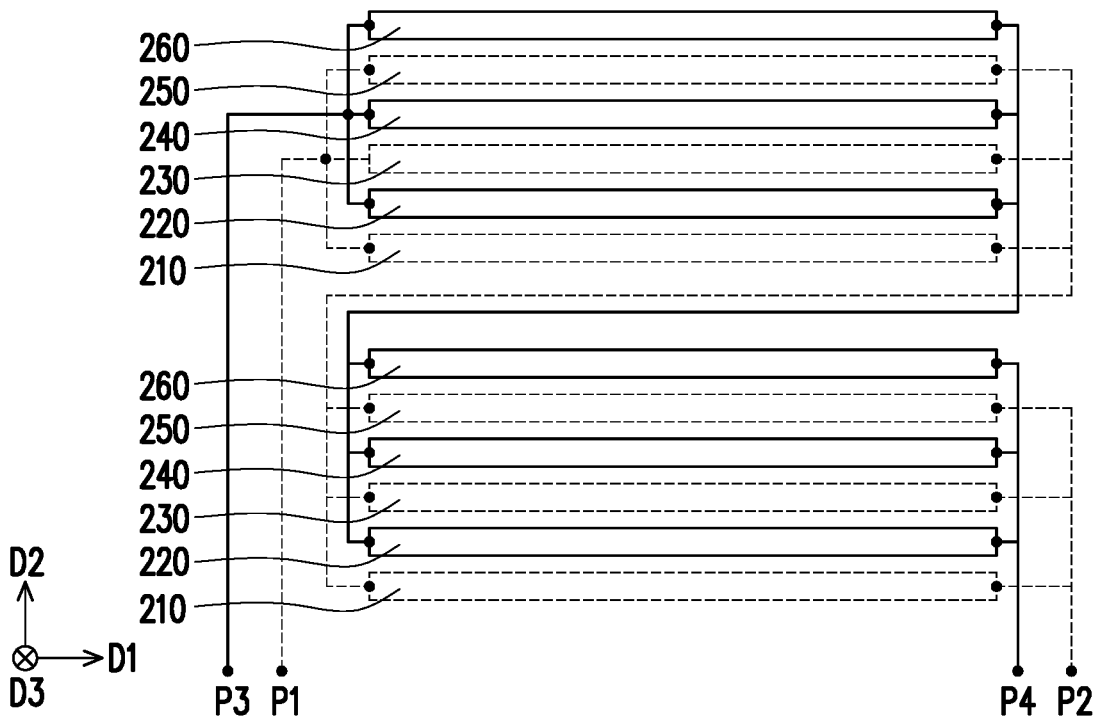
FIG. 10 is a schematic top view of testing conductive lines of a magnetic field sensing device of another embodiment of the invention.

FIG. 10 is a schematic top view of testing conductive lines of a magnetic field sensing device of another embodiment of the invention. Referring to FIG. 10, the plurality of groups of testing conductive lines in the magnetic field sensing device of the present embodiment are similar to the plurality of groups of testing conductive lines in the magnetic field sensing device of FIG. 9, and the differences between the two are: in the present embodiment, each group of the testing conductive lines further includes a fifth testing conductive line 250 and a sixth testing conductive line 260 that are respectively similar to the third testing conductive line 230 and the fourth testing conductive line 240, the first, third, and fifth testing conductive lines 210, 230, and 250 in each group of the testing conductive lines are connected in parallel with each other, and the second, fourth, and sixth testing conductive lines 220, 240, and 260 in each group of the testing conductive lines are connected in parallel with each other. In addition, the first, third, and fifth conductive lines 210, 230, and 250 between the groups are connected in series, and the second, fourth, and sixth testing conductive lines 220, 240, and 260 between the groups are also connected in series. In addition, a plurality of fifth magnetoresistor units and a plurality of sixth magnetoresistor units are also disposed above each group of the fifth and sixth testing conductive lines 250 and 260, respectively. They are respectively similar to the first magnetoresistor units 110 and the second magnetoresistor units 120, and are not shown in FIG. 10. Such a magnetic field sensing device can also achieve the building-in self-test function of the magnetic field sensing device of FIG. 1A.

Based on the above, in the magnetic field sensing device of the embodiments of the invention, since the first testing conductive line and the second testing conductive line are adopted and the driver is used to make two currents in the same direction or two currents in opposite directions pass through the first testing conductive line and the second testing conductive line at two different times, respectively, the magnetic field sensing device can have the building-in self-test function.

What is claimed is:

1. A magnetic field sensing device, comprising:
a plurality of first magnetoresistor units, arranged in a first direction, wherein a sensing direction of each of the first magnetoresistor units is perpendicular to the first direction;
a plurality of second magnetoresistor units, arranged in the first direction, wherein a sensing direction of each of the second magnetoresistor units is perpendicular to the first direction, the second magnetoresistor units are disposed on a side of the first magnetoresistor units in a second direction, and the first magnetoresistor units and the second magnetoresistor units are sequentially arranged in the second direction;
a first testing conductive line, disposed on a side of the first magnetoresistor units in a third direction, and extending in the first direction;
a second testing conductive line, disposed on a side of the second magnetoresistor units in the third direction, and extending in the first direction, wherein the third direction is different from the first direction and the second direction;

a driver, electrically connected to the first testing conductive line and the second testing conductive line, and configured to make two currents in a same direction and two currents in opposite directions pass through the first testing conductive line and the second testing conductive line at a first time and a second time, respectively, wherein the second time is different from the first time, and a direction of one of the two currents at the first time is different from the direction of one of the two currents at the second time;

a plurality of third magnetoresistor units, arranged in the first direction, wherein a sensing direction of each of the third magnetoresistor units is perpendicular to the first direction;

a plurality of fourth magnetoresistor units, arranged in the first direction, wherein a sensing direction of each of the fourth magnetoresistor units is perpendicular to the first direction, and the first magnetoresistor units, the second magnetoresistor units, the third magnetoresistor units, and the fourth magnetoresistor units are sequentially arranged in the second direction, a third testing conductive line, disposed on a side of the third magnetoresistor units in the third direction, and extending the first direction, wherein the third testing conductive line and the first testing conductive line are connected in parallel; and a fourth testing conductive line, disposed on a side of the fourth magnetoresistor units in the third direction, and extending in the first direction, wherein the fourth testing conductive line and the second testing conductive line are connected in parallel.

2. The magnetic field sensing device according to claim 1, wherein the first magnetoresistor units and the second magnetoresistor units comprise a plurality of anisotropic magnetoresistors, and the magnetic field sensing device comprises at least one magnetization direction setting element, disposed on a side of the first magnetoresistor units and the second magnetoresistor units in the third direction, and configured to set magnetization directions of the anisotropic magnetoresistors as at least one of the first direction and an opposite direction of the first direction, respectively.

3. The magnetic field sensing device according to claim 1, wherein the first magnetoresistor units and the second magnetoresistor units are electrically connected to form at least one Wheatstone bridge to output a voltage signal corresponding to a magnetic field component in the second direction, or output a voltage signal corresponding to the magnetic field component in the second direction and a magnetic field component in the third direction.

4. The magnetic field sensing device according to claim 1, wherein the sensing direction of each of the first magnetoresistor units is inclined with respect to the second direction, the sensing direction of each of the second magnetoresistor units is inclined with respect to the second direction, and an inclination direction of the sensing direction of each of the first magnetoresistor units with respect to the second direction is opposite to an inclination direction of the sensing direction of each of the second magnetoresistor units with respect to the second direction.

5. The magnetic field sensing device according to claim 4, wherein an inclination degree of the sensing direction of each of the first magnetoresistor units with respect to the second direction is the same as an inclination degree of the sensing direction of each of the second magnetoresistor units with respect to the second direction.

6. The magnetic field sensing device according to claim 1, wherein the first magnetoresistor units, the second magnetoresistor units, the third magnetoresistor units, and the fourth magnetoresistor units are electrically connected to form at least one Wheatstone bridge to output a voltage signal corresponding to a magnetic field component in the second direction, or output a voltage signal corresponding to the magnetic field component in the second direction and a magnetic field component in the third direction.

7. The magnetic field sensing device according to claim 1, wherein the first magnetoresistor units, the second magnetoresistor units, the third magnetoresistor units, and the fourth magnetoresistor units comprise a plurality of anisotropic magnetoresistors, and the magnetic field sensing device comprises at least one magnetization direction setting element, disposed on a side of the first magnetoresistor units, the second magnetoresistor units, the third magnetoresistor units, and the fourth magnetoresistor units in the third direction, and configured to set magnetization directions of the anisotropic magnetoresistors as at least one of the first direction and an opposite direction of the first direction, respectively.

8. The magnetic field sensing device according to claim 1, wherein the sensing direction of each of the first magnetoresistor units, the sensing direction of each of the second magnetoresistor units, the sensing direction of each of the third magnetoresistor units, and the sensing direction of each of the fourth magnetoresistor units are all inclined with respect to the second direction, an inclination direction of the sensing direction of each of the first magnetoresistor units with respect to the second direction is opposite to an inclination direction of the sensing direction of each of the second magnetoresistor units with respect to the second direction, an inclination direction of the sensing direction of each of the third magnetoresistor units with respect to the second direction is the same as the inclination direction of the sensing direction of each of the first magnetoresistor units with respect to the second direction, and an inclination direction of the sensing direction of each of the fourth magnetoresistor units with respect to the second direction is the same as the inclination direction of the sensing direction of each of the second magnetoresistor units with respect to the second direction.

9. The magnetic field sensing device according to claim 8, wherein an inclination degree of the sensing direction of each of the first magnetoresistor units with respect to the second direction is the same as an inclination degree of the sensing direction of each of the second magnetoresistor units with respect to the second direction, an inclination degree of the sensing direction of each of the third magnetoresistor units with respect to the second direction is the same as an inclination degree of the sensing direction of each of the fourth magnetoresistor units with respect to the second direction, and the inclination degree of the sensing direction of each of the first magnetoresistor units with respect to the second direction is the same as the inclination degree of the sensing direction of each of the third magnetoresistor units with respect to the second direction.

10. The magnetic field sensing device according to claim 1, further comprising:
a substrate, wherein the first testing conductive line and the second testing conductive line are disposed on the substrate; and
an insulating layer, covering the first testing conductive line and the second testing conductive line, wherein a top of the insulating layer comprises a groove, the groove comprises two opposite inclined side walls, and the first magnetoresistor units and the second magnetoresistor units are disposed on the two inclined side walls, respectively.

\* \* \* \* \*